United States Patent
Horii et al.

(10) Patent No.: US 6,177,284 B1
(45) Date of Patent: Jan. 23, 2001

(54) CONDUCTIVE DIFFUSION BARRIER LAYER, SEMICONDUCTOR DEVICE HAVING THE SAME, AND MANUFACTURING THEREOF

(75) Inventors: Hideki Horii; Cheol-seong Hwang, both of Kyungki-do (KR)

(73) Assignee: Samsung Electronics Co., Ltd., Suwon (KR)

( * ) Notice: Under 35 U.S.C. 154(b), the term of this patent shall be extended for 0 days.

(21) Appl. No.: 09/156,723

(22) Filed: Sep. 18, 1998

(30) Foreign Application Priority Data

Sep. 29, 1997  (KR) .................................................. 97-49759

(51) Int. Cl.$^7$ ..................................................... H01L 21/00
(52) U.S. Cl. ......................................................... 438/3; 438/3
(58) Field of Search ............................... 438/3, 240, 253, 438/254, 658, 660, 650, 656, 667, 683, 684, 685, 686, 238, 339

(56) References Cited

U.S. PATENT DOCUMENTS

| | | | |
|---|---|---|---|
| 5,736,422 | * | 4/1998 | Lee et al. ............................... 437/201 |
| 5,793,057 | * | 8/1998 | Summerfelt ............................. 257/55 |
| 5,846,859 | * | 12/1998 | Lee ........................................ 438/253 |
| 6,025,205 | * | 2/2000 | Park et al. .............................. 438/3 |

* cited by examiner

*Primary Examiner*—David Nelms
*Assistant Examiner*—David Nhu
(74) *Attorney, Agent, or Firm*—Marger Johnson & McCollom, P.C.

(57) ABSTRACT

A conductive diffusion barrier layer, a semiconductor device having the same, and a method for manufacturing the semiconductor device is provided. The diffusion barrier layer contains Al, N, and a metal element selected from the group consisting of Ta, Mo, Nb, and W. The content ratio of each element is between 1 and 60 mole percent. The diffusion barrier layer further contains O having a content ratio between 1 and 50 mole percent. A capacitor using the diffusion barrier layer described above exhibits a higher capacitance because the plug formed under a storage node is prevented from being oxidized and a dielectric layer having a high dielectric constant is formed.

9 Claims, 3 Drawing Sheets

CONDUCTIVE DIFFUSION BARRIER LAYER, SEMICONDUCTOR DEVICE HAVING THE SAME, AND MANUFACTURING THEREOF

BACKGROUND OF THE INVENTION

1. Field of the Invention

The present invention relates to a semiconductor device, and more particularly, to a semiconductor device having a conductive diffusion barrier layer and a manufacturing method thereof.

2. Description of the Related Art

In general, an integrated circuit in a semiconductor device includes circuit patterns formed of various materials. The material for forming the circuit patterns contains conductive materials such as aluminum (Al), platinum (Pt), copper (Cu), and wolfram (W), an insulating material such as a silicon oxide, and a conductive semiconductor material such as conductive silicon doped with an impurity. The circuit patterns formed of the above-listed materials are electrically connected to form a circuit. A conductive diffusion barrier layer is required for preventing movement of materials between the circuit patterns. The diffusion barrier layer is formed of TiN, TaN, TiSiN, or TaSiN. The diffusion barrier layer requires characteristics of high conduction stability, high diffusion suppressibility, and high oxidation resistance during subsequent thermal processes.

The diffusion barrier layer may be used for forming a capacitor on a semiconductor substrate. The diffusion barrier layer is formed at an interface between an electrode of the capacitor and a doped silicon layer. The diffusion barrier layer of the capacitor separates the electrode from the doped silicon layer thereby preventing materials from moving and diffusing. For example, in the capacitor using a dielectric layer such as a nitride/oxide (NO) layer or a $Ta_2O_5$ layer, the TiN, or TaN layer is used for the diffusion barrier layer.

As the semiconductor device becomes more highly integrated, a layout area occupied by the capacitor should be reduced, while the capacitance should increase. Accordingly, the dielectric layer formed of a high dielectric material such as BST $(Ba(Sr, Ti))O_3$ or PZT $(Pb(Zr, Ti))O_3$ is required for ensuring the capacitance. The dielectric layer has a dielectric constant approximately a hundred times higher than that of the conventional NO layer. Also, the process for forming the capacitor is simplified and the step coverage around the capacitor is improved.

The dielectric layer contains oxygen (O) atoms and is formed through annealing at an oxidation ambient gas. Thus, the electrode of the capacitor requires a conductive material such as Pt having good oxidation resistance and stability at high temperatures. However, the platinum reacts easily with the silicon of the silicon layer contacting the electrode. Thus, the diffusion barrier layer must be formed at an interface between the electrode and the silicon layer.

Meanwhile, the dielectric layer such as the BST layer or the PZT layer is formed through annealing at the oxidation ambient gas. Accordingly, the diffusion barrier layer contacting with the electrode of the capacitor, i.e., a Pt electrode and the silicon layer may be oxidized. That is, an oxide layer may be formed between the diffusion barrier layer and the silicon layer due to the oxidation ambient gas. Also, the diffusion barrier layer or the silicon layer may be oxidized thereby increasing the resistance of the interface thereof. The increase in resistance of the interface causes an unwanted reduction in the capacitance.

The oxygen diffused from the oxidation ambient gas used for forming the dielectric layer causes oxidation of the silicon layer. Therefore, in order to prevent the diffusion and movement of the oxygen, the diffusion barrier layer is preferably stable during oxidation and resists oxidation, particularly at high temperatures.

However, the diffusion barrier layer formed of TiN when exposed to the oxidation ambient gas, forms a nonconductive layer, such as a $TiO_2$ layer, when exposed to the oxidation ambient gas. The $TiO_2$ layer increases the resistance between the silicon layer and the electrode. Therefore, the diffusion barrier layer requires characteristics of stable oxidation resistance and conductivity at high temperatures thereby preventing diffusion of metal, silicon, and oxygen atoms.

SUMMARY OF THE INVENTION

It is an object of the present invention to provide a semiconductor device having a diffusion barrier layer that overcomes the problems associated with prior art semiconductor devices.

It is another object of the present invention to provide a semiconductor device having a conductive diffusion barrier layer that prevents diffusion of materials.

It is yet another object of the present invention to provide a semiconductor device having a conductive diffusion barrier layer that resists oxidation, particularly at high temperatures.

It is yet another object of the present invention to provide a capacitor for a semiconductor device having a conductive diffusion barrier layer that prevents diffusion of materials and resists oxidation at high temperatures.

It is yet another object of the present invention to provide a method for manufacturing a capacitor for a semiconductor device having a conductive diffusion barrier layer that prevents diffusion of materials and resists oxidation at high temperatures.

Accordingly, the present invention provides a semiconductor device comprising a diffusion barrier layer comprising of Al, N, and a metal element selected from the group consisting of Ta, Mo, Nb, and W and a conductive layer formed adjacent to the diffusion barrier layer. The content ratio of each of the Al, N, and the selected metal element in the diffusion barrier layer is between 1 and 60 mole percent. The diffusion barrier layer may further comprise O with an atomic concentration between 1 and 50 mole percent. The conductive layer is formed of Pt, Rh, Ru, Ir, Os, Pd, $PtO_x$, $RhO_x$, $OsO_x$, $PdO_x$, $CaRuO_3$, $SrRuO_3$, $CaIrO_3$, $SrIrO_3$, Cu, Al, Ta, $WSi_x$, Mo, $MoSi_x$, W, Au, TiN, or TaN.

The present invention provides a capacitor for a semiconductor memory device comprising an insulating layer pattern formed on a semiconductor substrate having a contact hole. A diffusion barrier layer pattern is electrically connected to the semiconductor substrate through the contact hole, the diffusion barrier layer comprises Al, N, and a metal element selected from the group consisting of Ta, Mo, Nb, and W. A storage node is formed on the diffusion barrier layer pattern and a dielectric layer is formed on the storage node. A plate node is formed on the dielectric layer. The capacitor further comprises a conductive plug inserted into the contact hole under the diffusion barrier layer pattern. The conductive plug is formed of a conductive material selected from the group consisting of Si, W, and a combination thereof. The storage and plate nodes comprise a conductive material selected from the group consisting of Pt, Rh, Ru, Ir, Os, Pd, $PtO_x$, $RhO_x$, $OsO_x$, $PdO_x$, $CaRuO_3$, $SrRuO_3$, $CaIrO_3$, $SrIrO_3$, Cu, Al, Ta, $Wsi_x$, Mo, $MoSi_x$, W, Au, TiN, and TaN. The content ratio of Al, N, and the selected metal element in the diffusion barrier layer is preferably between 1 and 60 mole percent. The diffusion barrier layer further comprises O with an atomic concentration between 1 and 50 mole percent. The dielectric layer comprises a dielectric material selected from the group consisting of $Ta_2O_5$, $SrTiO_3$, Ba(Sr, Ti)$O_3$, Pb(Zr, Ti)$O_3$, $SrBi_2Ta_2O_9$, (Pb, La)(Zr, Ti)$O_3$, and $Bi_4Ti_3O_{12}$.

The present invention provides a method for manufacturing a capacitor for a semiconductor device comprising forming an insulating layer pattern having a contact hole on a semiconductor substrate and forming a diffusion barrier layer electrically connected to the semiconductor substrate through the contact hole. The diffusion barrier layer comprises Al, N, and a metal element selected from the metal group consisting of Ta, Mo, Nb, and W. The method comprises forming a storage node layer on the diffusion barrier layer, patterning the storage node layer and the diffusion barrier layer to form a storage node and a diffusion barrier layer pattern. The method further comprises forming a dielectric layer on the storage node and forming a plate node on the dielectric layer. Additionally, a conductive plug is formed in the contact hole and under the diffusion barrier layer. The conductive plug preferably comprises a conductive material selected from the group consisting of Si, W, and a combination thereof. The diffusion barrier preferably comprises Al, N, and a metal selected from the group consisting of Ta, Mo, Nb, and W. The content ratio of each of the Al, N, and the selected metal element is between 1 and 60 mole percent. The diffusion barrier layer may also contain O with a preferred content ratio between 1 and 50 mole percent. The dielectric layer comprises a dielectric material selected from the group consisting of $Ta_2O_5$, $SrTiO_3$, Ba(Sr, Ti)$O_3$, Pb(Zr, Ti)$O_3$, $SrBi_2Ta_2O_9$, (Pb, La)(Zr, Ti)$O_3$, and $Bi_4Ti_3O_{12}$. The storage and plate nodes comprise a conductive material selected from the group consisting of Pt, Rh, Ru, Ir, Os, Pd, $PtO_x$, $RhO_x$, $OsO_x$, $PdO_x$, $CaRuO_3$, $SrRuO_3$, $CaIrO_3$, $SrIrO_3$, Cu, Al, Ta, $Wsi_x$, Mo, $MoSi_x$, W, Au, TiN, and TaN.

According to the present invention, the diffusion barrier layer has a surface on which a solid solution of Al and a metal such as Ta is formed thereby preventing diffusion of oxygen into the diffusion barrier layer that leads to more stable conductivity and a higher oxidation resistance. Accordingly, the conductive diffusion barrier layer may prevent defects such as an increase in contact resistance due to oxidation of the diffusion barrier layer and a lower layer thereof.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
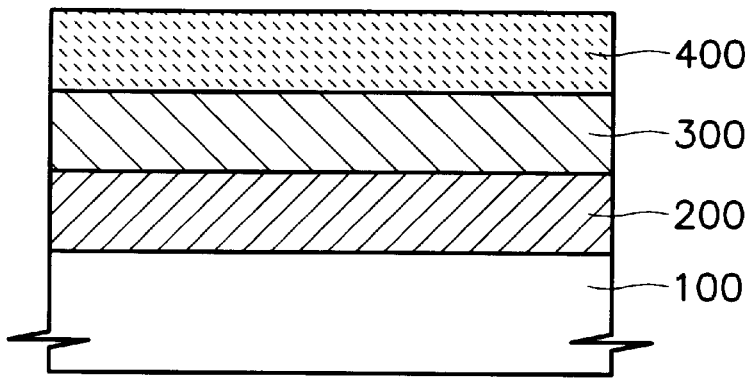
FIG. 1 is a sectional view of an first embodiment semiconductor device having a diffusion barrier layer according to the present invention.

The present invention now will be described more fully with reference to the accompanying drawings in which preferred embodiments of the invention are shown. This invention may, however, be embodied in many different forms and should not be construed as limited to the embodiments set forth herein. Rather, these embodiments are provided so that this disclosure will be thorough and complete and will fully convey the scope of the invention to those skilled in the art. In the drawings, the thickness of layers and regions are exaggerated for clarity. It should also be understood that when a layer is referred to as being "on" another layer or substrate, it can be formed directly on the other layer or substrate or intervening layers may be present.

Referring to FIG. 1, a diffusion barrier layer 300 is formed at an interface between first and second conductive layers 200 and 400. The first conductive layer 200 is formed of silicon doped with an impurity or a metal, e.g., a conductive material such as tungsten. The first conductive layer 200 indicates, for example, a plug for a capacitor electrode structure. The second conductive layer 400 is formed of one material selected from the group consisting of Pt, Rh, Ru, Ir, Os, Pd, $PtO_x$, $RhO_x$, $IrO_x$, $RuO_x$, $OsO_x$, $PdO_x$, $CaRuO_3$, $SrRuO_3$, $CaIrO_3$, Cu, Al, Ta, $Wsi_x$, Mo, $MoSi_x$, W, Au, TiN, TaN or a combination thereof. The second conductive layer 400 may indicate, for example, the electrode of the capacitor. The diffusion barrier layer 300 separates the conductive layers 200 and 400 at an interface therebetween suppressing material migration due to diffusion.

A compound layer containing Ta, Al, and N, i.e., a Ta—Al—N layer is preferably used for the diffusion barrier layer 300. The diffusion barrier layer 300 contains Ta having an atomic concentration between 1 and 60 mole percent. Also, the diffusion barrier layer 300 may contain a metal element selected from the 5A or the 6A family in the periodic table instead of Ta. Examples of metals included in the 5A or 6A family that may replace Ta include Mo, Nb, or W. At this time, the atomic concentration of selected metal from the group consisting of Mo, Nb and W is between 1 and 60 mole percent. The diffusion barrier layer 300 further contains Al and N each having an atomic concentration between 1 and 60 mole percent.

Alternatively, the diffusion barrier layer 300 may employ a compound layer such as a Ta—Al—N—O layer obtained by doping oxygen into the Ta—Al—N layer. The atomic concentration of each of Ta, Al, and N of the Ta—Al—N—O diffusion barrier layer 300 is between 1 and 60 mole percent and the atomic concentration of O is between 1 to 50 mole percent. Ta may be replaced in the Ta—Al—N—O diffusion barrier layer with Mo, Nb, or W where the atomic concentration of each element is between 1 and 60 mole percent.

The diffusion barrier layer 300 formed of a compound containing Ta, Al, and N or of a compound containing Ta, Al, N, and O is hereinafter described, however, the invention is not limited to the illustrated embodiment. The diffusion barrier layer 300 according to the present invention has better oxidation resistance and higher contact resistivity than those of the conventional TiN layer or TaN layer even at high-temperature annealing. That is, the contact resistivity between the first conductive layer 200 used as a plug and the second conductive layer 400 used as an electrode change little even after high-temperature annealing. Examples of the effect induced by diffusion barrier layer 300 will be described in detail with reference to FIGS. 2 and 3.

EXAMPLE 1

Figure 2:
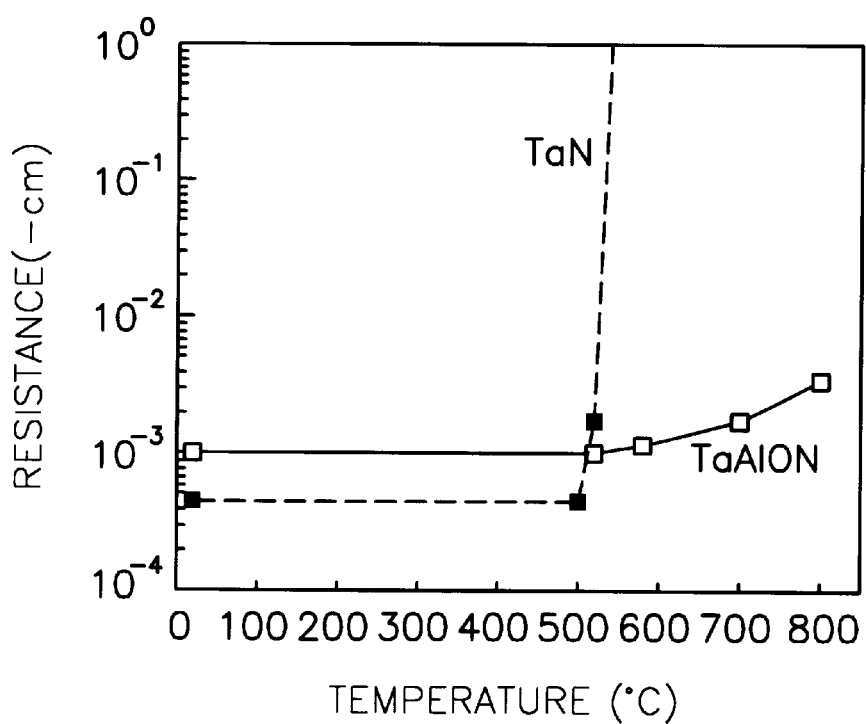
FIG. 2 is a graph of measured resistance values of a Ta—Al—N—O and a TaN layer annealed at an oxidation ambient gas at different annealing temperatures.

Resistivity of the Ta—Al—N and the Ta—Al—N—O Layer Annealed in Oxidation Ambient Gas Measured Using a 4-Point Probe FIG. 2 graphs the resistivity of a diffusion barrier layer having a Ta—Al—N—O layer and the resistivity of a diffusion barrier having a TaN layer. The Ta—Al—N—O layer and TaN layer shown in FIG. 2 are formed to approximately 50 nanometers thick and then annealed in the oxidation ambient gas. The oxidation ambient gas employs a gas obtained by adding oxygen of 1% to N. The annealing is performed from about room temperature to 800° C. FIG. 2 shows the changes in resistivity of the Ta—Al—N—O and TaN layers measured at various annealing temperatures using a 4-point probe measurement.

Referring to FIG. 2, the resistivity of the TaN layer increases from annealing at approximately 500° C. More specifically, the resistivity of the TaN layer rapidly increases at approximately 500 to 550° C. Accordingly, at approximately 600° C., the resistivity of the TaN layer is as high as the resistivity of an insulator. The above results show that the TaN layer begins to be rapidly oxidized at approximately 500 to 550° C. and that the TaN layer is almost completely oxidized at 600° C. or higher. In general, the TaN layer has oxidation resistance higher than the TiN layer. Therefore, it should be apparent to one skilled in the art that a TiN layer is completely oxidized at less than 600° C. The resistivity of the Ta—Al—N—O layer, on the other hand, does not rapidly increase at annealing temperatures of approximately 800° C. or higher. Therefore, the Ta—Al—N—O diffusion barrier layer maintains stable conductivity even at high temperatures. Accordingly, the Ta—Al—N—O layer does not readily oxidize at approximately 800° C. or higher. A dense $(Ta, Al)O_x$ layer is formed on the surface of the Ta—Al—N—O diffusion barrier layer that prevents oxygen atoms that are supplied by the oxidation ambient gas from being diffused into the Ta—Al—N—O layer. The content ratio of Ta and Al of the $(Ta, Al)O_x$ layer can be controlled arbitrarily. Also, an $Al_2O_3$ layer (an Al oxide) is an insulator while the $(Ta, Al)O_x$ layer (an oxide obtained by adding Ta to Al) is a conductor of sorts. Accordingly, the resistivity of the Ta—Al—N—O layer does not increase by the $(Ta, Al)O_x$ layer formed on the surface thereof. Therefore, the Ta—Al—N—O layer has stable conductivity even at high temperature annealing.

As described above, the Ta—Al—N—O layer according to the present invention has better oxidation resistance and more stable conductivity even at high temperatures than the conventional TiN or TaN diffusion barrier layers. Also, doping oxygen in the Ta—Al—N layer forms the Ta—Al—N—O layer. Accordingly, the Ta—Al—N layer in the oxidation ambient gas may realize an equivalent effect to the Ta—Al—N—O diffusion barrier layer. A diffusion barrier layer employing atoms such as Mo, Nb, or W instead of Ta, e.g., a Nb—Al—N—O layer, a Nb—Al—N layer, a Mo—Al—N—O layer, a Mo—Al—N layer, a W—Al—N—O layer, or a W—Al—N layer, are also equivalent to the Ta—Al—N—O layer.

EXAMPLE 2

Contact Resistivity of the poly-Si/Ti/Ta—Al—N—O Layer Structure Annealed at Oxidation Ambient Gas Measured Using a Kelvin Pattern A Ti layer is formed on a polysilicon (poly-Si) layer, i.e., a doped polycrystalline silicon layer or a doped polysilicon layer, to approximately 10 nanometers thick. A Ta—Al—N—O layer is formed on the Ti layer to approximately 100 nanometers thick to cover the Ti layer and the poly-Si layer. At this time, the Ti layer changes characteristics at the interface between the two adjacent layers. The poly-Si/Ti/Ta—Al—N—O layer structure is annealed at various temperatures and the oxidation ambient gas obtained by adding oxygen of 1% to N. The contact resistivity of a 1 micrometer squared area of the annealed poly-Si/Ti/Ta—Al—N—O layer structure is measured using a Kelvin pattern. The measured results are shown in FIG. 3.

Figure 3:
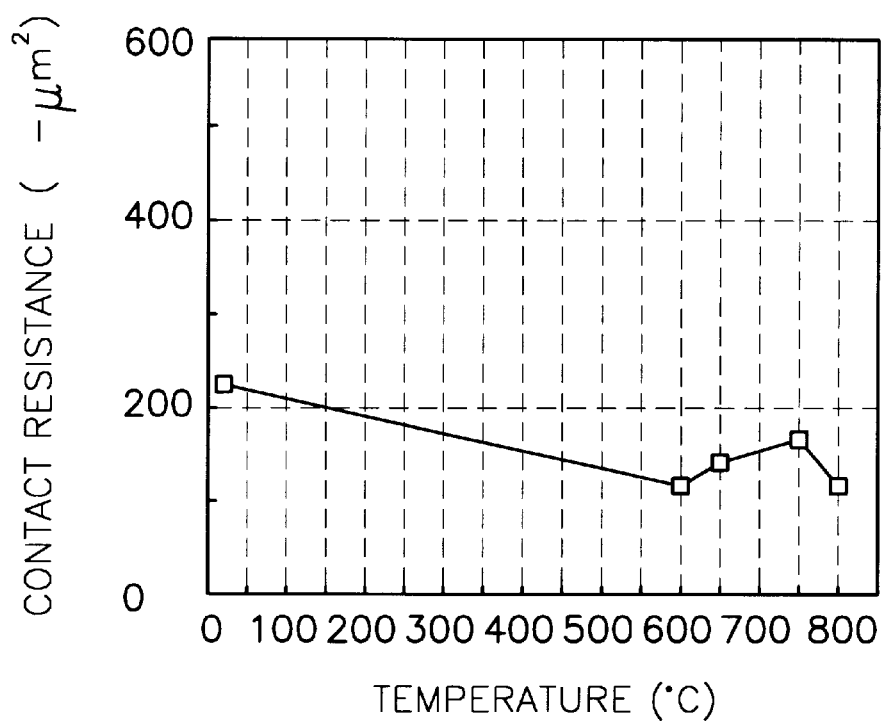
FIG. 3 is a graph of contact resistance values of a poly-Si/Ti/Ta—Al—N—O layer structure annealed at an oxidation ambient gas measured with a Kelvin pattern.

Referring to FIG. 3, the contact resistivity changes little with annealing temperatures. That is, the contact resistivity does not increase even at annealing temperatures equal to 800° C. or higher. This indicates that oxygen atoms are not diffused into either the Ti layer or the poly-Si layer even at 800° C. or higher because of the presence of the Ta—Al—N layer. Thus, oxidation of the Ti layer and poly-Si layer is prevented even at 800° C. or higher. Also, an increase in the resistivity due to the oxidation of the Ta—Al—N—O layer is prevented.

As described above, the Ta—Al—N layer or the Ta—Al—N—O layer can prevent diffusion of oxygen atoms at much higher annealing temperatures than that of a conventional TiN, TaN, TiSiN, or TaSiN diffusion barrier layer. Also, the Ta—Al—N layer or the Ta—Al—N—O layer exhibits little oxidation in the oxidation ambient gas at approximately 800° C. The resistance to oxidation is higher than the oxidation of the conventional diffusion barrier layer. Moreover, the Ta—Al—N layer or the Ta—Al—N—O maintain a more stable conductivity than the conventional TiN, TaN, TiSiN, or TaSiN layers. A diffusion barrier layer in which Ta is replaced by a metal such as Nb, Mo, or W may realize the above-described advantages. Good oxidation resistance and stable conductivity are realized, for example, in the Nb—Al—N—O, Nb—Al—N, Mo—Al—N, W—Al—N—O, or W—Al—N diffusion barrier layers.

Figure 4:
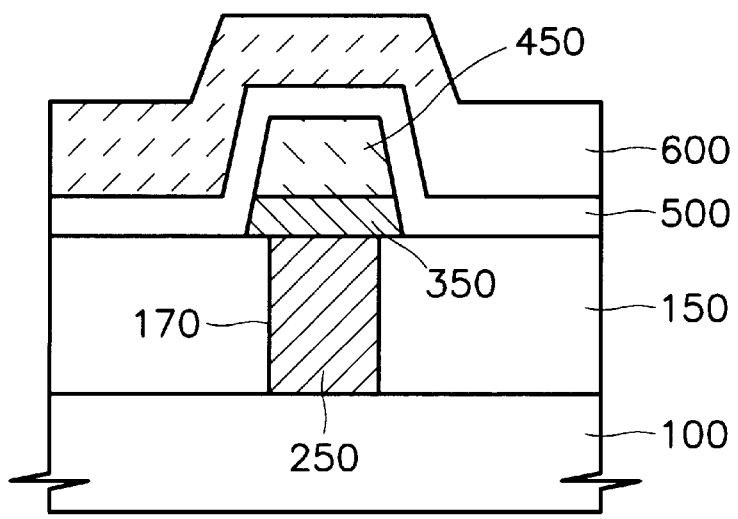
FIG. 4 is a sectional view of a capacitor according to the present invention.

Referring to FIG. 4, a capacitor according to the present invention includes an insulating layer pattern 150 including a contact hole 170 formed on a semiconductor substrate 100. The capacitor further includes a diffusion barrier layer pattern 350 electrically connected to the semiconductor substrate 100 by the contact hole 170. The diffusion barrier layer patter 350 contains Al, N, and a metal element such as Ta, Mo, and Nb. A storage node 450 is formed on the diffusion barrier layer pattern 350 and a dielectric layer 500 is formed on the storage electrode 450. A plate node 600 is formed on the dielectric layer 500.

Under the diffusion barrier layer pattern 350, a conductive plug 250 burying the contact hole 170 is formed. The conductive plug 250 is formed of a conductive material such as doped Si, W, or a combination of Si and W using a blanket or a selective chemical vapor deposition (CVD). The plug 250 electrically connects the diffusion barrier layer pattern 350 to the semiconductor substrate 100.

The storage and plate nodes 450 and 600 are formed of metals of the platinum group such as Pt, Rh, Ru, Ir, Os, and Pd, oxide metals of the platinum group such as PtOx, RhOx, IrOx, RuOx, OsOx and PdOx, or conductive materials such as $CaRuO_3$, $SrRuO_3$, $CaIrO_3$, $SrIrO_3$, Cu, Al, Ta, Wsix, Mo, MoSix, W, Au, TiN, and TaN. Also, the storage and plate nodes 450 and 600 may be formed of a compound of the metal of the platinum group, oxide metals of the platinum group, or a combination thereof.

The dielectric layer 500 is formed of a dielectric material having a high dielectric constant, e.g., $Ta_2O_5$, $SrTiO_3$, $Ba(Sr, Ti)O_3$, $Pb(Zr, Ti)O_3$, $SrBi_2Ta_2O_9$, $(Pb, La)(Zr, Ti)O_3$ or $Bi_4Ti_3O_{12}$. When the dielectric layer 500 is formed of the dielectric material, high-temperature annealing and oxidation ambient gas are required. Accordingly, the storage and plate nodes 450 and 600 are preferably formed of conductive material having good oxidation resistance.

The diffusion barrier layer 350 prevents reaction of the plug 250 with the storage node 450. Also, the diffusion barrier layer 350 prevents oxidation of the plug 250 due to the oxidation ambient gas used for forming the dielectric layer 500 thereby increasing the resistivity. Accordingly, the diffusion barrier layer 350 requires good oxidation resistance at high temperatures and a stable conductivity.

The diffusion barrier layer 350, i.e., the Ta—Al—N or the Ta—Al—N—O layer has good oxidation resistance and stable conductivity as shown in FIGS. 2 and 3. The diffusion barrier layer 350 does not oxidize in the oxidation ambient gas at temperatures of approximately 800° C. thereby preventing a rapid increase in the diffusion barrier layer resistivity. Moreover, the diffusion barrier layer 350 prevents oxygen from diffusing into the plug 250 thereby preventing oxidation of the plug 250. Accordingly, the diffusion barrier layer 350 also prevents a rapid increase in contact resistivity.

Therefore, the capacitance of the capacitor of the present invention, in which the Ta—l—N layer or the Ta—Al—N—O layer is employed for the diffusion barrier layer 350, is not decreased due to the increase in resistivity caused by the oxidation of the diffusion barrier layer 350 and the plug 250. Thus, the capacitor of the present invention exhibits increased capacitance over capacitors having conventional diffusion barrier layers.

Figure 5:
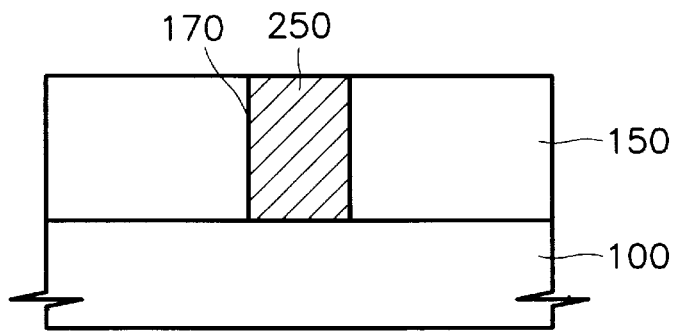
FIGS. 5 through 7 are sectional views of a semiconductor device used for illustrating a method for manufacturing a capacitor according to the present invention.
Figure 6:
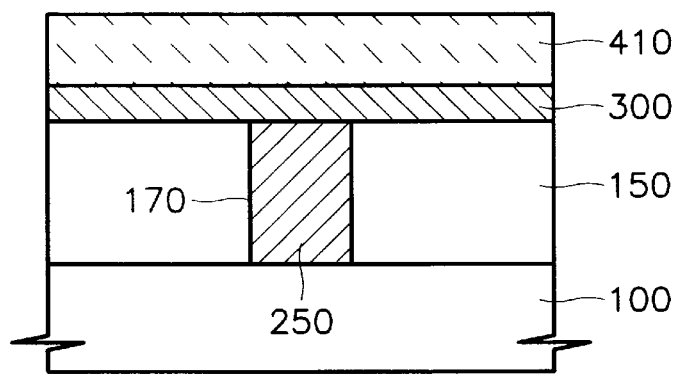
Figure 7:
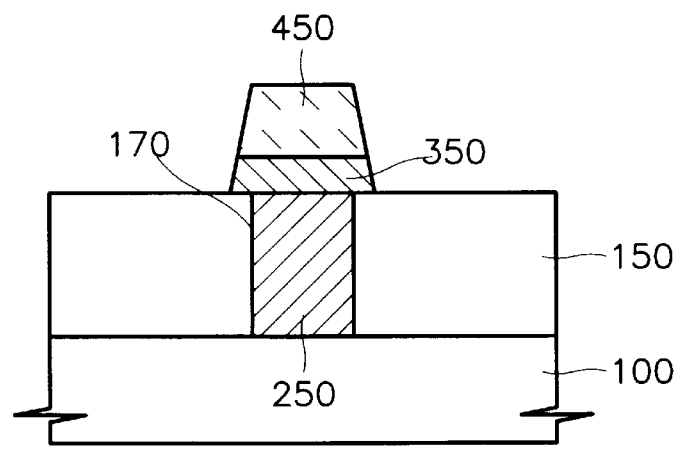

FIGS. 5–7 illustrate a method for manufacturing a capacitor according to the present invention. Referring to FIG. 5, the insulating layer pattern 150 is formed on the semiconductor substrate 100. An insulating layer such as a high temperature oxide (HTO) layer, an undoped silicate glass (USG) layer, a spin on glass (SOG) layer or a borophosphosilicate glass (BPSG) layer is formed on the semiconductor substrate 100 where a sub-structure (not shown) such as a transistor is formed. The insulating layer 150 is then patterned to form a contact hole 170 that exposes the semiconductor substrate 100 or the substructure (not shown).

Thereafter, a conductive material layer contacting with the semiconductor substrate 100 through the contact hole 170 is formed. Then, the conductive material layer is patterned, to thereby form a conductive plug 250 burying the contact hole 170. The plug 250 is formed of a conductive material such as doped Si, W, or a compound thereof through selective CVD.

Referring to FIG. 6, the diffusion barrier layer 300 and the storage node 410 are formed over the insulating layer pattern 150 and the conductive plug 250. The diffusion barrier layer 300 is electrically connected to the semiconductor substrate 100 through the plug 250 and is formed on the insulating layer pattern 150. The diffusion barrier layer 300 is formed of Al, N, and a metal element such as Ta, Mo, Nb, or W as described above. The diffusion barrier layer 300 may further contain O.

The process for forming the diffusion barrier layer 300 employing a Ta—Al—N—O layer is as follows. The semiconductor substrate 100 where the plug 250 is formed is introduced into a sputtering system, e.g., a DC reactive sputtering system. The preferred sputtering system employs a Ta—Al target. The Ta—Al—N—O diffusion barrier layer 300 is formed by inducing a DC power of approximately 300W and applying approximately 12 sccm of Ar gas, 5 sccm of N, and 1 sccm of O thereby forming a Ta—Al—N—O layer as the diffusion barrier layer 300 on the plug 250. At this time, the temperature on the semiconductor substrate 100, or on, alternatively, on the silicon wafer is maintained at approximately 200° C. Moreover, the Ta—Al—N—O diffusion barrier layer is formed to approximately 80 nanometers thick. The Ta—Al—N—O layer may be formed using a chemical vapor deposition (CVD) or a molecular beam epitaxial (MBE) thin film method.

Thereafter, the storage node layer 410 is formed on the diffusion barrier layer 300 of a conductive material layer having oxidation resistance as described above with reference to FIG. 4. The conductive material for the storage node 410 is Pt, Rh, Ru, Ir, Os, Pd, PtOx, RhOx, IrOx, RuOx, OsOx, PdOx, CaRuO$_3$, SrRuO$_3$, CaIrO$_3$, SrIrO$_3$, Cu, Al, Ta, Wsix, Mo, MoSix, W, Au, TiN, TaN, or a combination thereof.

The storage node layer 410 is formed as follows. The Ta—Al—N—O diffusion barrier layer 300 is formed on the substrate 100 and then a Pt layer is formed on the Ta—Al—N—O layer using the DC reactive sputtering system. The Pt layer is used for the storage node 410. The Pt layer is formed by inducing a DC power of approximately 1000W and applying approximately 20 sccm of Ar ambient gas. The Pt layer is approximately 100 nanometers thick. The temperature of the semiconductor substrate 100 is maintained at approximately 200° C. The storage node layer 410 may be formed by methods different from those described and still come within the scope of the present invention.

FIG. 7 illustrates patterning the storage node layer 410 and the diffusion barrier layer 300. An etch stop layer pattern (not shown), i.e., a photoresist pattern is formed on the storage node layer 410. Then, etching the storage node layer 410 using the photoresist pattern as a mask forms a storage node 450. A dry etching process such as reactive ion etching (RIE) is presently preferred to etch the storage node layer 410. Patterning the diffusion barrier layer 300 under the storage node 450 forms a diffusion barrier layer pattern 350.

A dielectric layer 500 covering the storage node 450 and a plate node 600 are formed as shown in FIG. 4. The dielectric layer 500 is formed of a dielectric material having a high dielectric constant of approximately 40 nanometers. The preferred dielectric material for the dielectric layer 500 is Ta$_2$O$_5$, SrTiO$_3$, Ba(Sr, Ti)O$_3$, Pb(Zr, Ti)O$_3$, SrBi$_2$Ta$_2$O$_9$, (Pb, La)(Zr, Ti)O$_3$, Bi$_4$Ti$_3$O$_{12}$ or a combination thereof. The dielectric material for the dielectric layer 500 contains O. Also, the dielectric layer 500 and the plate node 600 are formed through annealing in the oxidation ambient gas.

Oxygen is diffused into the plug 250 and into the diffusion barrier layer pattern 350 through annealing in the oxidation ambient gas. As described above with reference to FIGS. 2 and 3, the Ta—Al—N layer or the Ta—Al—N—O layer have good oxidation resistance at high temperatures thereby preventing oxidation of the plug 250. Accordingly, an increase in the resistivity of the diffusion barrier layer pattern 350, the plug 250, and the storage node 450 is prevented thereby improving the capacitance of the capacitor.

The plate node 600 on the dielectric layer 500 is formed of a conductive material layer having good oxidation resistance. The plate node 600 is formed using an identical process to the process described for forming the storage node layer 450. Forming the plate node 600 completes formation of the capacitor.

According to the present invention, a Ta—Al—N, Ta—Al—N—O, Nb—Al—N—O, Nb—Al—N, Mo—Al—N—O, Mo—Al—N, W—Al—N—O or W—Al—N layer that is interposed at an interface between the conductive layers as the diffusion barrier layer, has better oxidation resistance and more stable conductivity than those of the conventional TiN or TaN layers at high temperatures. Accordingly, oxygen does not penetrate the Ta—Al—N, Ta—Al—N—O, Nb—Al—N—O, Nb—Al—N, Mo—Al—

N—O, Mo—Al—N, W—Al—N—O, or W—Al—N layers or a conductive layer thereunder due to diffusion. That is, the conductive layer under the diffusion barrier layer, e.g., the Si or W layer, is protected thereby preventing an increase in resistivity due to the oxidation of the conductive layer.

Also, in the capacitor according to the present invention including the Ta—Al—N, Ta—Al—N—O, Nb—Al—N—O, Nb—Al—N, Mo—Al—N—O, Mo—Al—N, W—Al—N—O or W—Al—N layer as the diffusion barrier layer, oxygen does not penetrate due to diffusion into the plug allowing formation of the dielectric layer. Thus, a rapid increase in resistivity caused by oxidation of the plug and the diffusion barrier layer is prevented. That is, the conductivity of the plug and the diffusion barrier layer is stably maintained thereby suppressing reduction in capacitance due to the increase in resistivity. Therefore, a dielectric material layer having a high dielectric constant requiring high-temperature annealing in the oxidation ambient gas may be employed for the dielectric layer of the capacitor thereby realizing a capacitor having the capacitance required for a highly-integrated semiconductor device.

What is claimed is:

1. A method for manufacturing a capacitor in a semiconductor device, comprising:

forming an insulating layer pattern having a contact hole on a semiconductor substrate;

forming a diffusion barrier layer electrically connected to the semiconductor substrate through the contact hole, the diffusion barrier layer being formed of Ta—Al—O—N by sputtering a Ta—Al target in an atmosphere containing nitrogen and oxygen gas;

forming a storage node layer on the diffusion barrier layer;

patterning the storage node layer and the diffusion barrier layer to form a storage node and a diffusion barrier layer pattern;

forming a dielectric layer on the storage node; and forming a plate node on the dielectric layer.

2. The method for manufacturing of claim 1 comprising forming a conductive plug in the contact hole and under the diffusion barrier layer.

3. The method for manufacturing of claim 2 wherein the conductive plug is formed of a conductive material selected from the group consisting of Si, W, and a combination thereof.

4. The method for manufacturing of claim 1 wherein the storage and plate nodes comprise a conductive material selected from the group consisting of Pt, Rh, Ru, Ir, Os, Pd, $PtO_x$, $RhO_x$, $OsO_x$, $PdO_x$, $CaRuO_3$, $SrRuO_3$, $CaIrO_3$, $SrIrO_3$, Cu, Al, Ta, $Wsi_x$, Mo, $MoSi_x$, W, Au, TiN, and TaN.

5. The method for manufacturing of claim 1 wherein the diffusion barrier layer comprises between 1 and 60 mole percent of the metal element.

6. The method for manufacturing of claim 1 wherein the diffusion barrier layer comprises between 1 and 60 mole percent Al.

7. The method for manufacturing of claim 1 wherein the diffusion barrier layer comprises between 1 and 60 mole percent N.

8. The method for manufacturing of claim 1 wherein the diffusion barrier layer comprises between 1 and 60 mole percent O.

9. The method for manufacturing of claim 2 wherein the dielectric layer is formed of a dielectric material selected from the group consisting of $Ta_2O_5$, $SrTiO_3$, $Ba(Sr, Ti)O_3$, $Pb(Zr, Ti)O_3$, $SrBi_2Ta_2O_9$, $(Pb, La)(Zr, Ti)O_3$, and $Bi_4Ti_3O_{12}$.

* * * * *

UNITED STATES PATENT AND TRADEMARK OFFICE
CERTIFICATE OF CORRECTION

PATENT NO.    : 6,177,284 B1
DATED         : January 23, 2001
INVENTOR(S)   : Horii et al.

Page 1 of 1

It is certified that error appears in the above-identified patent and that said Letters Patent is hereby corrected as shown below:

Column 6,
Lines 51-52, "PtOx, RhOx, IrOx, RuOx, OsOx and PdOx" should read -- $PtO_x$, $RhO_x$, $IrO_x$, $RuO_x$, $OsO_x$ and $PdO_x$ --.
Lines 53-54, "Wsix, Mo, MoSix" should read -- $Wsi_x$, Mo, $MoSi_x$ --.

Column 7,
Line 17, "Ta—1—N" should read -- Ta—Al—N --.

Column 8,
Lines 7-8, "PtOx, IrOx, RuOx, OsOx, PdOx" should read -- $PtO_x$, $IrO_x$, $RuO_x$, $OsO_x$, $PdO_x$ --.
Line 9, "Wsix, Mo, MoSix" should read -- $Wsi_x$, Mo, $MoSi_x$ --.

Signed and Sealed this

Seventh Day of May, 2002

*Attest:*

*Attesting Officer*

JAMES E. ROGAN
*Director of the United States Patent and Trademark Office*